(12) United States Patent
Kim et al.

(10) Patent No.: US 7,541,276 B2
(45) Date of Patent: Jun. 2, 2009

(54) METHODS FOR FORMING DUAL DAMASCENE WIRING FOR SEMICONDUCTOR DEVICES USING PROTECTIVE VIA CAPPING LAYER

(75) Inventors: Jae Hak Kim, Fishkill, NY (US); Sun Jung Lee, Seoul (KR); Seung Jin Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 283 days.

(21) Appl. No.: 11/223,311

(22) Filed: Sep. 9, 2005

(65) Prior Publication Data

US 2006/0178002 A1   Aug. 10, 2006

(30) Foreign Application Priority Data

Feb. 5, 2005    (KR) .................... 10-2005-0010981

(51) Int. Cl.
*H01L 21/4763* (2006.01)
(52) U.S. Cl. .................. 438/618; 438/627; 438/629; 438/637; 438/672; 257/E21.641
(58) Field of Classification Search ......... 437/618–687; 257/E21.641
See application file for complete search history.

(56) References Cited

U.S. PATENT DOCUMENTS

| 6,297,149 | B1 * | 10/2001 | Stamper ..................... 438/637 |
| 6,383,920 | B1 * | 5/2002 | Wang et al. ................. 438/639 |
| 6,448,176 | B1 | 9/2002 | Grill et al. |
| 6,458,705 | B1 | 10/2002 | Hung et al. |
| 6,656,841 | B1 * | 12/2003 | Kim ........................... 438/687 |
| 6,689,695 | B1 * | 2/2004 | Lui et al. .................... 438/700 |
| 2002/0182894 | A1 * | 12/2002 | Andideh ..................... 438/796 |
| 2004/0087164 | A1 * | 5/2004 | Bao et al. ................... 438/694 |
| 2004/0142554 | A1 | 7/2004 | Lui et al. |
| 2004/0266169 | A1 * | 12/2004 | Sakata ........................ 438/622 |
| 2005/0106856 | A1 * | 5/2005 | Chen et al. .................. 438/633 |
| 2006/0216929 | A1 * | 9/2006 | Park et al. ................... 438/637 |
| 2006/0292863 | A1 * | 12/2006 | Gambino et al. ............ 438/638 |
| 2007/0020944 | A1 * | 1/2007 | Chae et al. .................. 438/725 |

FOREIGN PATENT DOCUMENTS

| CN | 1505834 | 6/2004 |
| KR | 20000035543 | 6/2000 |
| TW | 521385 | 2/1992 |
| TW | 574745 | 2/1993 |

(Continued)

OTHER PUBLICATIONS

English Abstract for Publication No. 1020000035543.

(Continued)

*Primary Examiner*—H. Jey Tsai
(74) *Attorney, Agent, or Firm*—F. Chau & Associates, LLC.

(57) ABSTRACT

Exemplary embodiments of the invention generally include methods for forming multilayer metal interconnect structures using dual damascene methods that incorporate a via capping process to protect lower interconnection lines from etching damage or oxidation, for example, that may be caused by inadvertent exposure of lower interconnection lines to etching atmospheres.

38 Claims, 8 Drawing Sheets

FOREIGN PATENT DOCUMENTS

| | | |
|---|---|---|
| TW | 444278 | 7/2001 |
| TW | 461028 | 10/2001 |
| TW | 494534 | 7/2002 |
| TW | 495910 | 7/2002 |
| TW | 504760 | 10/2002 |
| TW | 508741 | 11/2002 |
| TW | 516180 | 1/2003 |
| TW | 516182 | 1/2003 |
| TW | 543101 | 7/2003 |

OTHER PUBLICATIONS

Preliminary Notice to First Office Action, Search Report, and English Translation for Taiwan Patent Application No. 095103703 dated Dec. 21, 2007.

Preliminary Notice to First Office Action, Search Report, and English Translation for Taiwan Patent Application No. 09720222170 dated Apr. 29, 2008.

* cited by examiner

METHODS FOR FORMING DUAL DAMASCENE WIRING FOR SEMICONDUCTOR DEVICES USING PROTECTIVE VIA CAPPING LAYER

CROSS-REFERENCE TO RELATED APPLICATION

This application claims priority to Korean Patent Application No. 10-2005-0010981, filed on Feb. 5, 2005, which is incorporated herein by reference.

TECHNICAL FIELD OF THE INVENTION

The present invention relates generally to methods for fabricating metal wiring layers of a semiconductor device and, in particular, methods for forming interconnect structures using dual damascene methods that incorporate a via capping process to protect lower interconnection lines from damage or oxidation caused by subsequent etching processes, which can result in contact failure between lower and upper interconnections lines.

BACKGROUND

Due to continued technological innovations in the field of semiconductor fabrication that allow integrated circuits to be designed according to smaller design rules (DR), semiconductor devices are becoming more highly integrated. Typically, highly integrated circuits are designed using multi-layered metal interconnection structures in which the wires/interconnects are formed from different metals layers of an integrated circuit. Generally, multi-layered metal interconnection lines are formed of a metallic material, such as copper (Cu), having low resistivity and high reliability to yield improved performance. However, copper is difficult to pattern using a conventional photolithography/etching techniques, especially when the copper wires are formed according to relatively small design rules. Accordingly, dual damascene methods have been developed to enable formation of highly integrated copper metal interconnect structures.

In general, dual damascene methods are used to form upper metal lines that are electrically connected to lower metal lines. More specifically, a dual damascene method typically includes process steps including forming a via hole and a trench region in an interlayer dielectric (ILD) layer formed over a lower metal line. The via hole is formed in the ILD layer in alignment with a predetermined region of the lower metal line, and the trench region is formed to have a line-shaped groove that crosses over the via hole. Typically, a thin etch stop layer is formed between the lower metal line layer of a substrate and the ILD layer as a means for protecting the lower metal line. The upper metal lines and contacts are formed by filling the via hole and a trench region in the ILD layer with conductive material (such as copper). The conductive material in the via hole forms a via contact between the lower metal line and the upper metal line formed by the conductive material filling the trench region.

Although dual damascene methods allow formation of metal interconnect structures that yield improved performance, such methods become more problematic with decreasing design rules. For instance, with decreasing design rules, parasitic resistance and capacitance that exists between adjacent metal wiring layers in a lateral direction or in a vertical direction may affect the performance of the semiconductor devices. Such parasitic resistance and capacitance components in a metal wiring layer generally cause a decrease in the operating speed, and thus deteriorate the electrical characteristics of the device. Further, the parasitic resistance and capacitance components increase the total power consumption of chips in the semiconductor device and an amount of signal leakage.

To address these issues, interlayer dielectric material having low dielectric constants have been used to reduce parasitic capacitances. Moreover, to decrease capacitance, the ESL (etch stop layer) between the lower metal line and ILD layer is formed as thin as possible. However, even when the ILD layer is selected to have an etching selectivity to the etch stop layer, when forming the via hole in the ILD layer, the portion of the etch stop layer that is exposed through the via hole can be etched such that the lower metal line is exposed to the etching atmosphere. The exposure of the lower metal line to an etching atmosphere can result in certain defects such as formation of black vias (which are recesses formed in exposed surface of lower metal line) or copper lifting. Moreover, during a subsequent ashing process to remove a photoresist pattern, the exposed surface of the lower metal line may react with oxygen and form a metal oxide layer. Such oxidation increases the electrical resistance of the metal interconnect structure and may result a defective contact between the via and lower metal line due to a lifting phenomenon.

SUMMARY OF THE INVENTION

Exemplary embodiments of the invention generally include methods for forming multilayer metal interconnect structures using dual damascene methods that incorporate a via capping process to protect lower interconnection lines from etching damage or oxidation, for example, which may be caused by inadvertent exposure of lower interconnection lines to etching atmospheres.

In one exemplary embodiment, a method is provided for forming an interconnection structure. An etch stop layer is formed on a semiconductor substrate that has a lower conductive layer formed thereon, forming an ILD (interlayer dielectric) layer on the etch stop layer. A via hole is formed through the ILD layer to expose a portion of the etch stop layer, wherein the via hole being aligned with a portion of the lower conductive layer. The exposed portion of the etch stop layer is removed to expose a portion of the lower conductive layer. A via capping layer is formed on the exposed portion of the lower conductive layer. A sacrificial material layer is deposited to fill the via hole with sacrificial material. A trench aligned with the via hole is then formed by etching the sacrificial material layer and ILD layer. The sacrificial material remaining in the via hole is then removed to expose the via capping layer. An upper interconnection is formed by filling the trench and via hole with a conductive material.

In one exemplary embodiment, the via capping layer is formed by selectively forming the via capping layer on the exposed portion of the conductive layer. The via capping layer may be formed with a thickness in a range of about 50 angstroms to about 500 angstroms. The via capping layer may be formed of a material having copper diffusion barrier properties and/or a material which is resistant to corrosion or oxidation.

In one exemplary embodiment of the invention, the via capping layer can be selectively formed using an electroless deposition process, wherein the via capping layer is formed of a material including CoWP, CoSnP, CoP, CoB, CoSNB, Pd, IN or NiB. In another exemplary embodiment, the via capping layer is selectively formed using a chemical vapor deposition process, wherein the via capping layer is formed of a material including W, WNx, Ta, TaNx, Ti or TiNx. In yet another exemplary embodiment, the via capping layer can be selectively formed using an atomic layer deposition process, wherein the via capping layer is formed of a material including W, WNx, Ta, TaNx, Ti or TiNx.

In one exemplary embodiment of the invention, the via capping layer may be part of the resulting interconnection structure. In particular, in one exemplary embodiment, the interconnection is formed by forming a conformal barrier layer on the trench and via sidewalls and the via capping layer, depositing a layer of conductive material over the conformal barrier layer to fill the via hole and trench with the conductive material, and planarizing the layer of conductive material.

In another exemplary embodiment, the via capping layer is removed before forming the interconnection structure. In particular, in one exemplary embodiment, the interconnection is formed by forming a first conformal barrier layer on the trench and via sidewalls and the via capping layer, removing the via capping layer and portion of the first conformal barrier layer to expose the portion of the lower conductive layer, forming a second conformal barrier layer on the first conformal barrier layer and the exposed portion of the lower conductive layer;, depositing a layer of conductive material over the second conformal barrier layer to fill the via hole and trench with the conductive material, and planarizing the layer of conductive material. In one exemplary embodiment, the via capping layer and portion of the first conformal barrier are removed using a sputtering process, such as Ar sputtering.

These and other exemplary embodiments, aspects, objects, features and advantages of the present invention will become apparent from the following detailed description of exemplary embodiments, which is to be read in connection with the accompanying drawings.

BRIEF DESCRIPTION OF THE DRAWINGS

FIGS. 1 through 10A~10b are cross-sectional views illustrating methods for forming a metal wiring layer of a semiconductor device according to exemplary embodiments of the invention.

FIGS. 11 through 18A~18B are cross-sectional views illustrating methods for forming a metal wiring layer of a semiconductor device according to other exemplary embodiments of the invention.

DETAILED DESCRIPTION OF EXEMPLARY EMBODIMENTS

Figure 1:
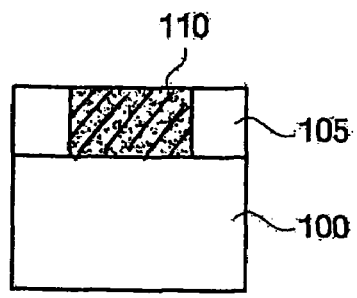

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

FIGS. 1 through 10A~10B are schematic cross-sectional views illustrating methods for forming metal wiring layers of a semiconductor device according to exemplary embodiments of the present invention. More specifically, FIGS. 1 through 10A~10B illustrate methods for forming multilayer metal interconnect structures using dual damascene methods that incorporate a via capping process to protect lower interconnection lines from etching damage or oxidation, for example, that may be caused by inadvertent exposure of lower interconnection lines to etching atmospheres. FIGS. 1~9 and 10A illustrate a method in which the via capping layer is formed as part of the dual damascene interconnection structure, and FIGS. 1~9 and 10B illustrate a method in which the via capping layer is removed before forming an upper metal line and contact to a lower metal line.

Referring to FIG. 1, a semiconductor substrate (100) is shown having a first ILD (inter layer dielectric) layer (105) (or insulation layer) and lower interconnection line (110) formed thereon. The substrate (100) may be any semiconductor device such as a silicon substrate having integrated circuit devices formed therein. In one exemplary embodiment, the first ILD layer (105) is formed on the semiconductor substrate (100) and the lower interconnection line (110) is formed in the ILD layer (105) using a damascene technique. The lower interconnection line (110) may be formed of any suitable material typically used to form conductive layers for integrated circuits. For instance, the lower-interconnection line may comprise a metallic material such as copper, a copper alloy, aluminum, aluminum alloy, tungsten or other suitable metals or conductive materials.

Figure 2:
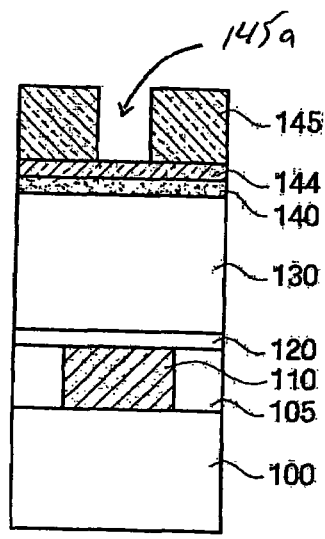

Referring to FIG. 2, an etch stop layer (120) (or barrier layer), a second ILD layer (130) and a capping layer (140) (or hard mask layer) are sequentially formed on the structure of FIG. 1. The etch stop layer (120) acts as an etch stop layer for a subsequent via etch process (described below) to prevent exposure of the lower interconnection line (110). The etch stop layer (120) also acts as a diffusion barrier layer to prevent/reduce diffusion of the metallic material into the ILD layer (130). The etch stop layer (120) is made as thin as possible to maintain an overall low dielectric characteristic of the insulation stack (120 and 130), while providing a sufficient diffusion barrier. In one exemplary embodiment, the etch stop layer (120) is formed of an insulating material having a thickness of about 300 to about 500 angstroms, and having a high etching selectivity with respect to the ILD layer (130). For example, the etch stop layer (120) may be formed of SiC, SiN, SiCN, SiCO or SiCON, for example, and formed using known techniques.

In one exemplary embodiment, the ILD layer (130) is preferably formed of a low-k dielectric material with k less than about 4.2. The ILD layer (130) may be formed of an organic polymer material or an inorganic material. More specifically, the ILD layer (130) may be formed of a silicon oxide layer doped with carbon, fluorine or hydrogen atoms, e.g., a silicon oxycarbide (SiOC) layer, a SiOCH layer, a fluorosilses-quioxane layer (FSQ) layer, a hydro-silses-quioxane (HSQ) layer or a methyl-silses-quioxane (MSQ) layer. Whatever materials are used for the etch stop layer (120) and ILD layer (130), the ILD layer (130) is preferably formed of a material having a high etching selectivity with respect to the stopper layer (120) and having a low dielectric constant.

The capping layer (140) (or hard mask layer) may be formed to protect the ILD layer (130) from being damaged during plasma processes and to act as a buffer layer for a subsequent CMP process. The capping layer (140) is formed with a material having a high etching selectivity with respect to the ILD layer (130). For example, the hard mask layer (140) may be formed of: (i) an insulating nitride layer, such as a silicon nitride layer (SiN), a silicon carbonitride layer (SiCN) or a boron nitride layer (BN); (ii) an insulating carbide layer, such as a silicon carbide layer (SiC); (iii) a metal nitride layer, such as a tantalum nitride (TaN) layer, a titanium nitride (TiN) layer, a tungsten nitride (WN) layer or an aluminum nitride (AlN) layer; (iv) a metal oxide layer, such as an aluminum oxide ($AL_2O_3$) layer, a tantalum oxide (TaO) layer or a titanium oxide (TiO) layer; or (v) a silicon layer such SiO2, or other materials such as SiOF and SiON, for example.

A next step in the exemplary process includes forming a via hole in the ILD layer (130). For example, as further depicted in FIG. 2, an ARL (anti-reflection layer) (144) is formed on the capping layer (140) and a photoresist pattern (145) is formed having an opening (145a) through which a portion of the surface of the ARL (144) is exposed. The opening (145a) is aligned to the lower interconnect line (110) and defines a pattern for forming a via hole (150), as depicted in FIG. 3.

Figure 3:
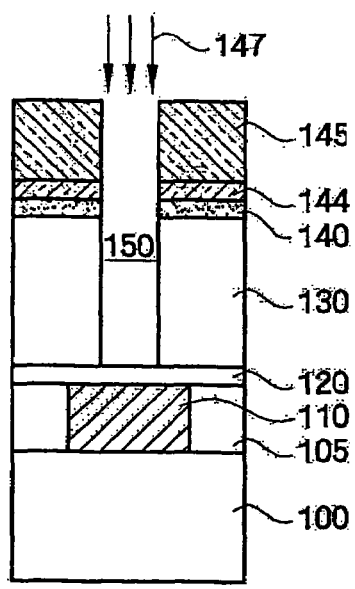

In particular, referring to FIG. 3, one or more separate etch processes (147) are applied to the structure of FIG. 2 using the photoresist pattern (145) as an etching mask, to thereby sequentially etching the ARL (144), the capping layer (140) and the ILD layer (130) to form the via hole (150) down to the etch stop layer (120). The ILD layer (130) may be etched using any conventional etch process, such as an anisotropic dry oxide etch process, which is suitable to etch the material of the ILD layer (130).

Figure 4:
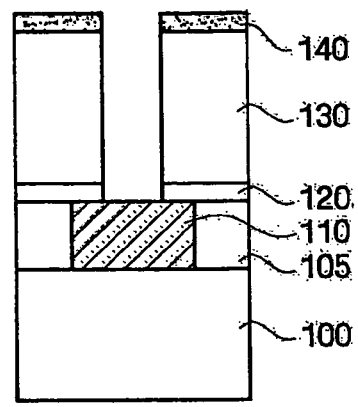

After the via hole (150) is formed, the photoresist pattern (145) and ARL (144) are removed using, e.g., an ashing process (O2 or H2 plasma) and organic stripper. Thereafter, portion of the etch stop layer (120) which is exposed through the via hole (150) is etched to expose the surface of a portion of the lower interconnection line (110). FIG. 4 depicts the exemplary structure after removal of the photoresist pattern (145) and ARL (144), and etching the portion of the etch stop layer (120) to expose a portion of the lower interconnection line (110) through the via hole (150).

Figure 5:
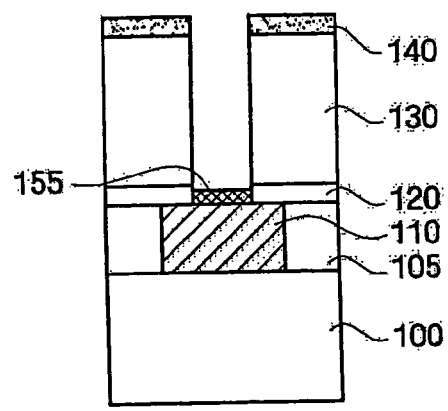

Referring now to FIG. 5, a via capping layer (155) is formed on the exposed portion of the lower interconnection line (110). The via capping layer (155) is formed to protect the lower interconnection line (110) from plasma/etch damage and/or copper oxidation during subsequent processes. In one exemplary embodiment, the via capping layer (155) is formed to have a thickness of about 50 angstroms to about 500 angstroms. The via capping layer (150) is preferably formed of a material having copper diffusion barrier properties (e.g., copper diffusion inhibition) and/or of a material which is resistant to corrosion or oxidation.

The via capping layer (155) may be selectively formed on the exposed portion of the lower interconnection line (155) using one of various methods in accordance with the invention. For example, in one exemplary embodiment, the via capping layer (155) is selectively formed using known electroless deposition methods (such as the methods disclosed in U.S. Patent Publication No. 2002-123220). With electroless deposition, the via capping layer (155) may be formed of a material including CoWP, CoSnP, CoP, CoB, CoSNB, Pd, IN or NiB, for example. In another exemplary embodiment, the via capping layer (155) may be selectively formed using a chemical vapor deposition (CVD) process. With CVD, the via capping layer may be formed of a material including W, WNx, Ta, TaNx, Ti or TiNx, for example. In yet another exemplary embodiment of the invention, the via capping layer (155) is selectively formed using an atomic layer deposition (ALD) process. With ALD, the via capping layer (155) may be formed of a material including W, WNx, Ta, TaNx, Ti or TiNx, for example.

Figure 6:
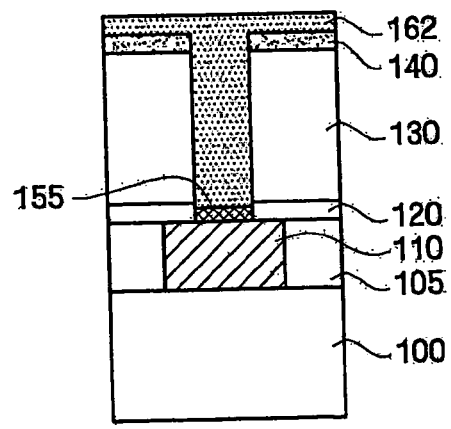

Referring to FIG. 6, after formation of the via capping layer (155), the via hole (150) is filled with a sacrificial material by depositing a layer of sacrificial material (162). Preferably, the sacrificial material (162) is formed of a material having uniform gap filling characteristics to minimize formation of voids in the sacrificial material (162). In one exemplary embodiment, the sacrificial material (162) is formed of an organic spin-on-polymer (SOP) material such as polyaryleneether based material, a polymetamethylacrylate based material, or a vinylether metacrylate based material. In another exemplary embodiments of the invention, the sacrificial material (162) is formed of an inorganic spin-on-glass (SOG) material such as an HSQ (HydrogenSilsesQuioxane) based material, an MSQ (MethylSisesQuioxane) based material.

The sacrificial material (162) is preferably selected to have dry etch properties that are similar to the dry etch properties of the dielectric material that forms the ILD layer (130). For example, the sacrificial material (162) preferably has a dry etch rate that is slightly faster than the dry etch rate of the ILD layer (130) for a given dry etch chemistry. As explained below, this ensures that a sufficient amount of sacrificial material remains in the via hole (150) after forming a trench region. Moreover, the sacrificial material (162) is selected to have a wet etch rate that is significantly faster than the wet etch rate of the ILD layer (130). As explained below, this enables removal of the remaining sacrificial material in the via hole (150) after the trench regions is formed. Whether an SOP or SOG sacrificial material is used will depend on the material that forms the ILD layer (130) and the desired etch selectivity between the ILD layer (130) and sacrificial material (162) for the given etch chemistries.

Figure 7:
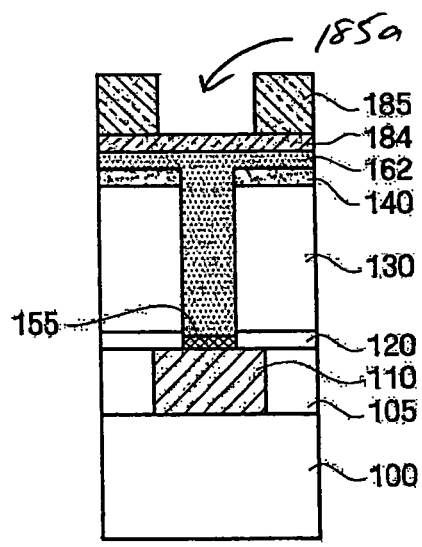

A next step in the exemplary process is forming a trench region in the ILD layer (130). Referring to FIG. 7, the exemplary process commences with forming a second ARL (anti-reflection layer) (184) on the layer of sacrificial material (162) and forming a second photoresist pattern (185) having an opening (185a) through which a portion of the surface of the second ARL (184) is exposed. The opening (185a) is formed to align to the via hole (150), and the opening (185a) defines an etch pattern for forming a trench in the ILD layer (130), as explained hereafter.

Figure 8:
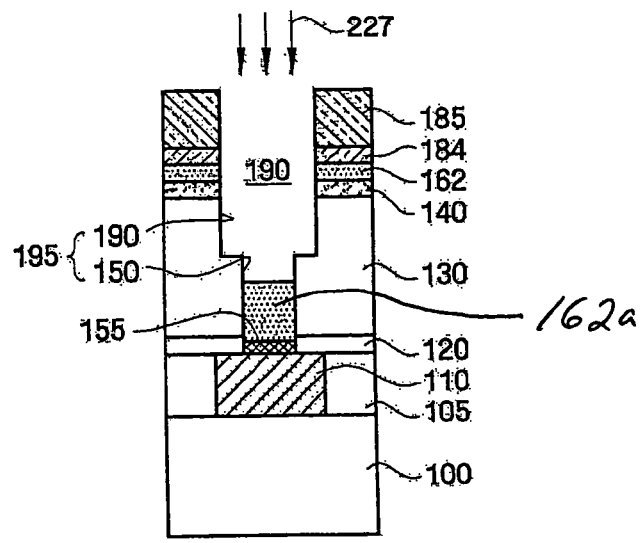

Referring to FIG. 8, an etch process (227) is performed to form a trench (190) by sequentially etching the ARL (184), the sacrificial material (162) and the ILD layer (130) using the photoresist pattern (185) as an etching mask. In one exemplary method, the etching (227) is performed using a dry etch process with an etch chemistry that is suitable for etching the types of materials forming the different layers. As noted above, the dry etch chemistry for etching the trench (190) is selected such that the sacrificial material (162) is etched at faster rate than the IDL layer (130) to avoid formation of defects. In particular, the etching is performed such that the etch rate between the sacrificial material (162) and the ILD (130) is substantially the same or lower than 10:1. The etching process is applied for a time sufficient to form a trench (190) having a desired trench depth below the top surface of the ILD layer (130). During the dry etching process, the sacrificial material (162a) remaining in the via hole (150) is recessed below the bottom of the trench (190) such that a non-filled region (195) is formed that comprises the trench (190) and a portion of the via hole (150).

Figure 9:
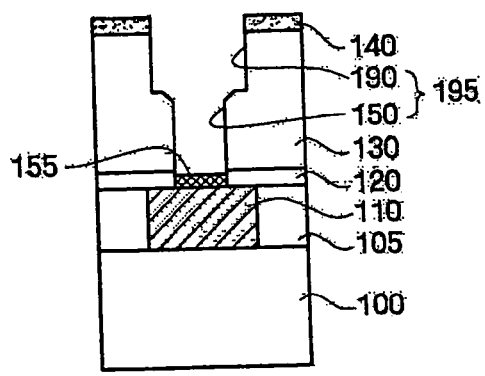

FIG. 9 is a schematic side view of the structure of FIG. 8 after the remaining sacrificial material (162, 162a) and photoresist (185) and ARL (184). In one exemplary embodiment, the second photoresist pattern (185) and ARL (184) are removed using an ashing process, for example, followed by removal of the sacrificial material (162). If the sacrificial material (162) comprises an organic material, the sacrificial material (162) is removed along with the second photoresist pattern (185). When the sacrificial material (162) is an inorganic SOG material, the sacrificial material that is formed on the hard mask layer (140), as well as the sacrificial material (162a) remaining in the via hole (150), is removed using a wet etch process, after the photoresist pattern (185) and ARL (184) are removed. As noted above, a wet etch chemistry (e.g., such as an HF solution) is selected such that the sacrificial material is selectively etched at a significantly faster rate that the ILD layer (130). For example, if the sacrificial material (162) is formed of a SOG layer (such as an HSQ layer) and the ILD layer (130) is formed of SiOC, the sacrificial material (162) will be etched significantly faster in an HF solution than the ILD layer (130). In short, the wet chemistry is selected to provide high selectivity between the sacrificial material (162) and the material of the ILD layer (130).

Figure 10A:
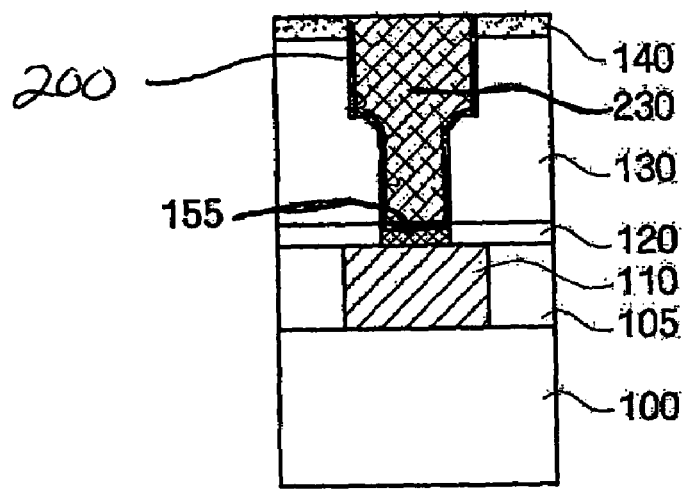
Figure 10B:
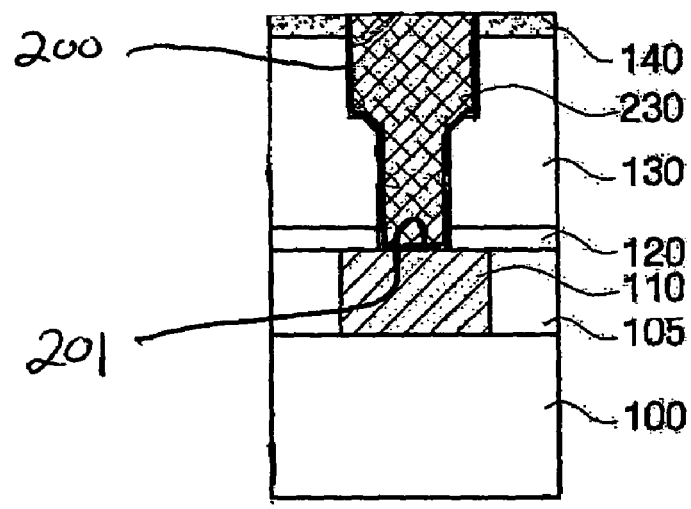

The next step of the exemplary method includes forming the upper metal interconnection (dual damascene interconnection) by filling the trench (190) and via hole (150) with a conductive material such as copper. FIGS. 10A and 10B depict various exemplary embodiments for this process, wherein an interconnection structure (230) is formed over the via capping layer (155) (FIG. 10A) and wherein the interconnection structure (230) is formed after removing the via capping layer (155).

More specifically, in one embodiment, referring to FIG. 10A, a method of forming the upper interconnection structure (230) includes forming a conformal barrier layer (200) on the sidewalls of the trench (190) and the via hole (150) and on the surface of the via capping layer (155). In one exemplary embodiment, the barrier layer (200) may be formed using a sputter deposition process to form a barrier layer of thickness of about 50 angstroms to about 500 angstroms with a material such as TiN or TaN, for example. Thereafter, a layer of conductive material is deposited over the conformal barrier layer (200) to fill the via hole (150) and trench (190) with the conductive material. For instance, the conductive material may be copper that is deposited using a conventional electroplating process. A planarization process (e.g., CMP) is then performed to planarize the top surface of the structure down to the hard mask layer (140), thus completing formation of a metal wiring layer having the dual damascene structure (230).

In another exemplary embodiment of the invention, referring to FIG. 10B, a process of forming the upper interconnection structure (230) includes forming a first conformal barrier layer (200) on the sidewalls of the trench (190) and the via hole (150) and on the surface of the via capping layer (155), and then etching the bottom layer of the via hole (150) to remove the via capping layer (155) and the portion of the first conformal barrier layer on the surface of the via capping layer (155), to thereby expose a portion of the lower interconnection line (110). In one exemplary embodiment, the via capping layer (155) and the first conformal barrier (200) on the surface thereof, can be removed using a sputtering process such as Ar sputtering. Moreover, the Ar sputtering may be performed to remove a thin layer of the upper surface of the lower interconnection line (110) to remove damaged regions that may exist.

Then, a second conformal barrier layer (201) is formed over the first conformal barrier layer (200) and the exposed portion of the lower interconnection line (110), followed by depositing a layer of conductive material over the second conformal barrier layer (201) to fill the via hole (150) and trench (190) with the conductive material. Thereafter, the structure is planarized (e.g., via CMP) to remove the conductive material and barrier material down to the surface of the hard mask layer (140), thus completing formation of the dual damascene structure (230).

The exemplary methods described above with reference to FIGS. 1 through 10A/10B are via first dual damascene (VFDD) methods that are performed using single layered resist (SLR) processes. With the exemplary VFDD SLR methods, the sacrificial material may be an organic or an inorganic material. In other exemplary embodiments of the invention, VFDD multi-layered resist (MLR) methods are provided, which will be described with reference to the exemplary diagrams of FIGS. 11~18A/18B. With these exemplary methods, the sacrificial material is formed of an organic material to act as a photoresist during an etch process. The exemplary methods of 11~18A/18B will be described beginning with reference to FIG. 11, but it is to be understood that the exemplary methods described above with reference to FIGS. 1~5 are processing steps that may precede the processing steps of FIG. 11.

Figure 11:
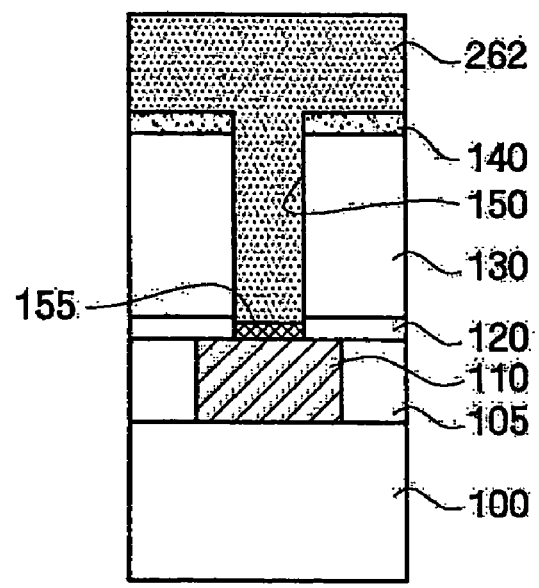

Referring to FIG. 11, after formation of the via capping layer (155) (e.g., FIG. 5), the via hole (150) is filled with sacrificial material by depositing layer of sacrificial material (262) to fill the via hole (150). Preferably, the sacrificial material (262) is formed of a material having uniform gap filling characteristics to minimize formation of voids in the sacrificial material (262). In the exemplary embodiment, the sacrificial material (262) is formed of an organic spin-on-polymer (SOP) material such as polyaryleneether based material, a polymetamethylacrylate based material, or a vinylether metacrylate based material. As with the exemplary embodiments discussed above, the sacrificial material (262) is preferably selected to have given dry and wet etch properties with respect to the dielectric material that forms the ILD layer (130) to achieve the desired etching selectivities for etching the trench region and removing residual sacrificial material in subsequent processing steps as discussed below.

Comparing the exemplary diagram of FIG. 11 and FIG. 6, it is noted that the layer of sacrificial material (262) in FIG. 11 is formed thicker than the layer of sacrificial material (162) shown in FIG. 6. The sacrificial material (262) is formed sufficiently thick in this exemplary embodiment because, as will be explained below (FIG. 16), the layer of sacrificial material (262) is used as an etch mask during a subsequent etch process.

Figure 12:
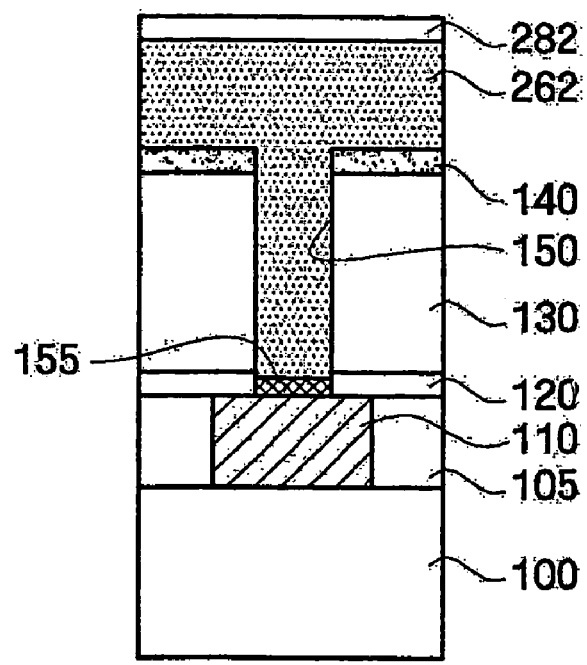

Referring to FIG. 12, a hard mask layer (282) is formed on the layer of sacrificial material (262). The hard mask layer (282) may be a silicon oxide layer, a silicon nitride layer, a silicon carbide layer, SiON, SiCN, SiOCN, Ta, TaN, Ti, TiN, Al2O3, BQ, HSQ. The material forming the hard mask layer (282) is selected to have a high etching selectivity with respect to the sacrificial material (262).

Figure 13:
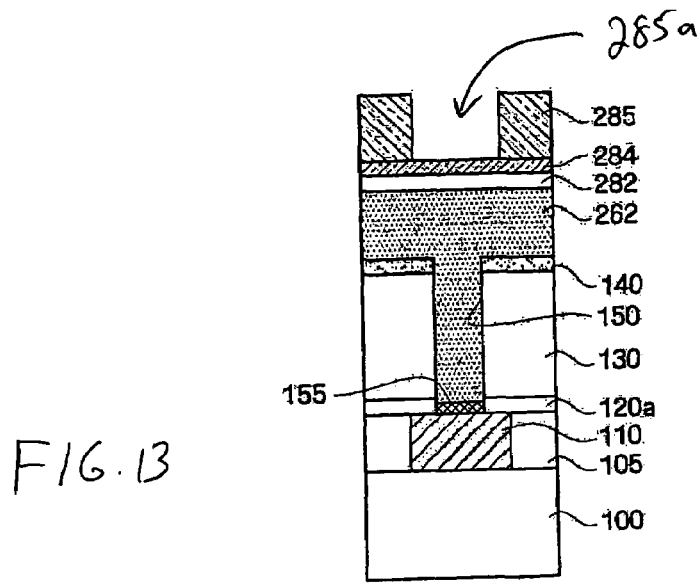

Referring to FIG. 13, an ARL (anti-reflection layer) (284) is formed on the hard mask layer (282) and a photoresist pattern (285) is formed having an opening (285a) through which a portion of the surface of the ARL (284) is exposed. The opening (285a) is formed to align to the via hole (150), and the opening (285a) defines an etch pattern for forming a trench region in the ILD layer (130).

Figure 14:
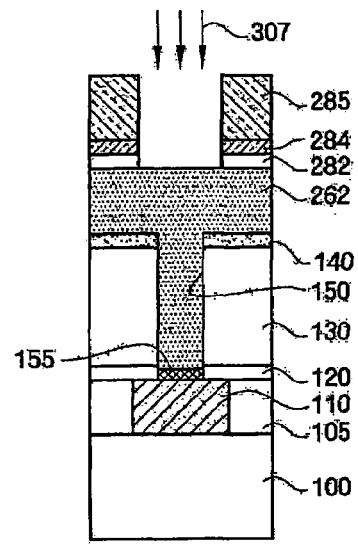

Referring to FIG. 14, one or more etch processes (307) are performed using the photoresist pattern (285) as an etch mask to sequentially etch the portions of the ARL (284) and hard mask layer (282) exposed by the opening (285a). In one exemplary embodiment, the etch process (307) is performed using the photoresist pattern (285) as an etching mask, to thereby sequentially etch the ARL (284) and the hard mask layer (282). Preferably, the etch process (307) is performed with a single dry etch process using an etch chemistry that is suitable for etching the types of materials forming the different layers (284) and (282).

Figure 15:
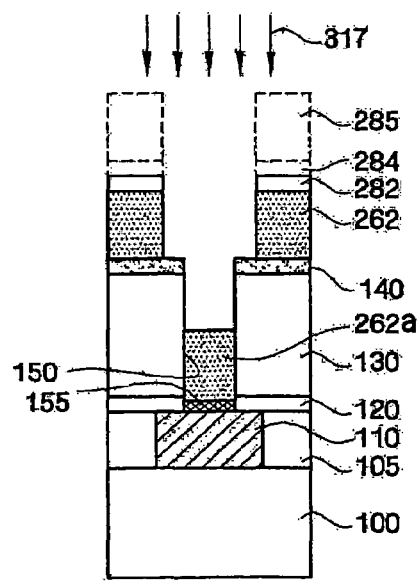

Referring to FIG. 15, a second etch process (317) is performed for a given period of time to etch the sacrificial material (262) exposed by opening (285a). The second etch process (317) is performed with an etch chemistry that causes the photoresist pattern (285) and ARL (284) to be removed while etching the sacrificial material (262). In one embodiment, the second etch process (317) is performed using a dry etch process with an etch chemistry that is suitable for etching the types of materials forming the different layers. The dry etch chemistry is preferably selected such that the sacrificial material (262) is etched at faster rate than the ILD layer (130) to avoid formation of defects. In particular, the etching is performed such that the etch rate between the sacrificial material (262) and the ILD (130) is substantially the same or lower than 10:1. As depicted in FIG. 15, the second etch process (317) is performed to etch the sacrificial material (262a) down to a level in the via hole (150) which is the same or lower than a desired trench level. With the exemplary etch process (317), the patterned hard mask layer (282) is exposed.

Figure 16:
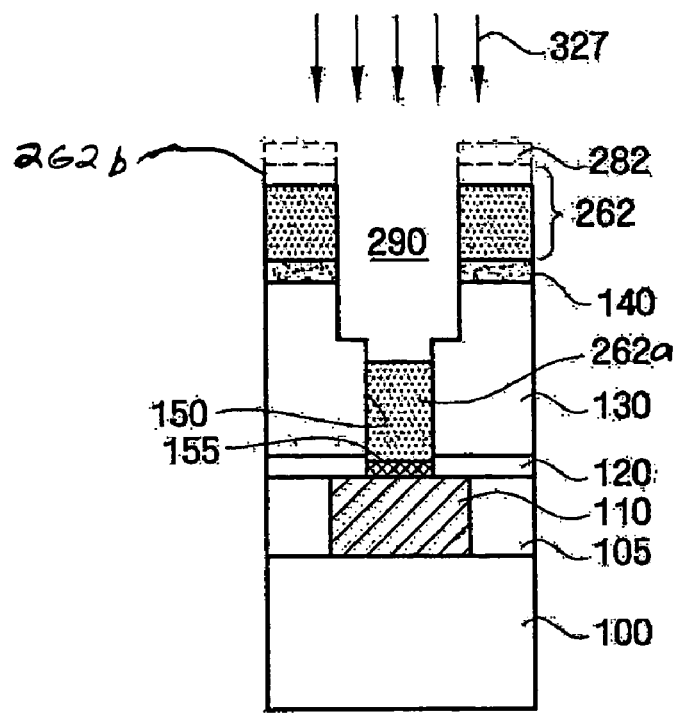

Referring to FIG. 16, a third etch process (327) is performed using the patterned hard mask layer (282) and sacrificial material layer (262) as an etch mask to etch the exposed portions of the capping layer (140) and ILD layer (130) to form a trench (290). In the exemplary embodiment, the exposed portions of the capping layer (140) and ILD layer (130) are etched to form the trench (290) to a desired level below the top surface of the ILD layer (130).

In one exemplary method, the etching (327) is performed using an etch chemistry that is highly selective to hard mask layer (282), the capping layer (140) and ILD layer (130) with respect to the sacrificial material (262). In this manner, the capping layer (140) and ILD layer (130) are etched at a significantly greater rate than the sacrificial material (262) such that the sacrificial material (262) above capping layer (140) acts as an etch mask after the hard mask layer (282) is etched away, and such that the sacrificial material (262a) in the bottom of the via hole (150) is not over etched, thereby protecting the via capping layer (155) and lower interconnection line (110) from exposure to the etching atmosphere. For example, as depicted in FIG. 16, a relatively small amount of sacrificial material (262b) is etched away during this etch process (327).

In one exemplary embodiment, the etch process (327) is performed using a dry etch process with an etch chemistry that is selected such that the sacrificial material (262a, 262) is etched at slower rate than the ILD layer (130) to avoid formation of defects. In particular, the etching is performed such that the etch rate between the sacrificial material (262a, 262) and the ILD layer (130) is substantially faster than 1:10.

Figure 17:
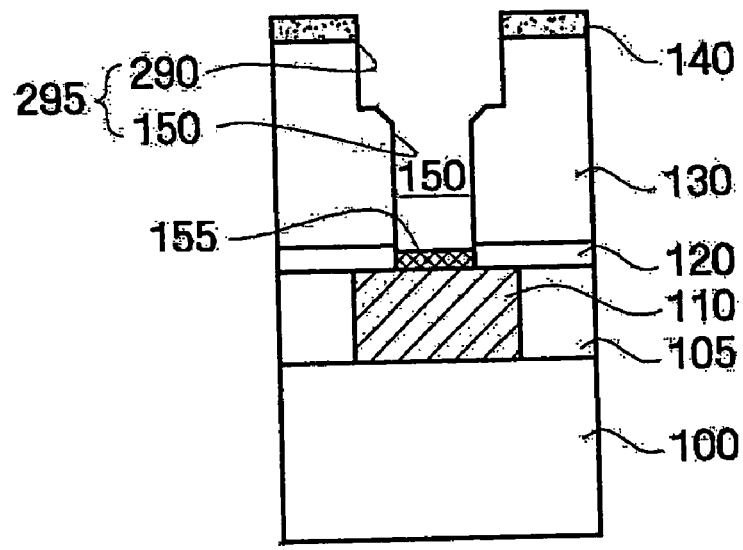
Figure 18A:
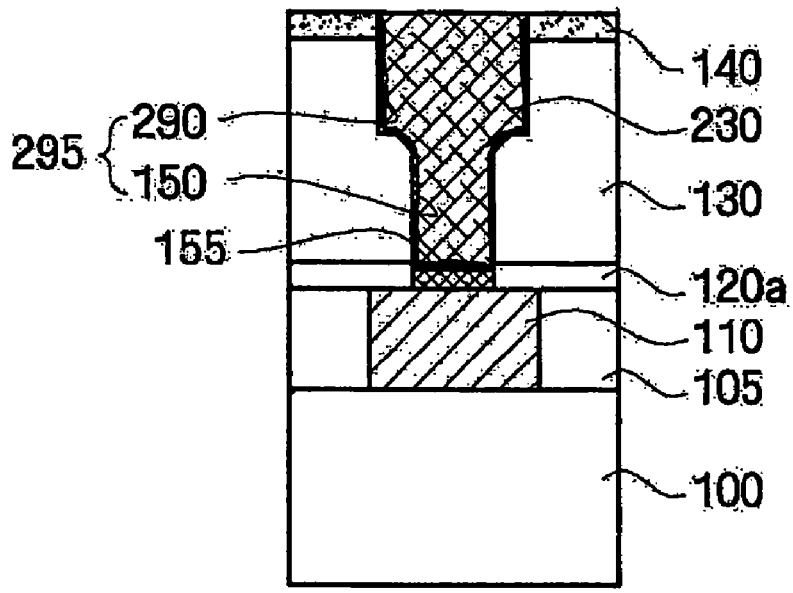
Figure 18B:
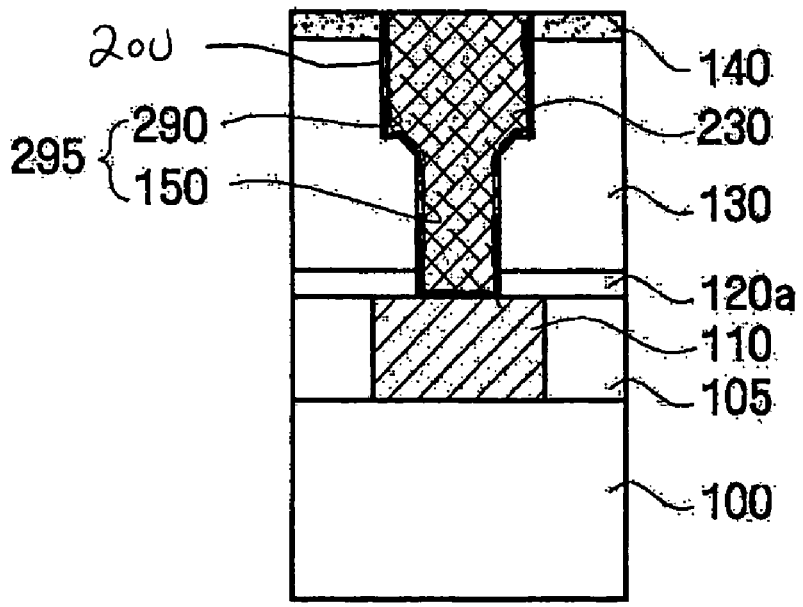

Next, the remaining sacrificial material (262a, 262) (depicted in FIG. 16) is removed to expose the capping layer (140) and the via capping layer (155). FIG. 17 is a schematic side view of the structure of FIG. 16 after the remaining sacrificial material (262, 262a) is removed. The sacrificial material (262, 262a) can be removed using an ashing process, for example, or other etching method having an etch chemistry that enables the organic material that forms the sacrificial material (262) to be etched at a rate that is relatively greater than the etch rate of the material which forms the ILD layer (130).

The next step of the exemplary method includes forming the upper metal interconnection (dual damascene interconnection) by filling the trench (290) and via hole (150) with a conductive material such as copper. Starting with the exemplary structure depicted in FIG. 17, the same fabrications methods discussed above with reference to FIGS. 10A and 10B can be used to form the structures depicted in FIGS. 10A and 10B.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for forming an interconnection structure, comprising:
   forming an etch stop layer on a semiconductor substrate that has a lower conductive layer formed thereon;
   forming an ILD (interlayer dielectric) layer on the etch stop layer;
   forming a capping layer on the ILD layer;
   forming a via hole through the capping layer and the ILD layer to expose a portion of the etch stop layer, the via hole being aligned with a portion of the lower conductive layer;
   removing the exposed portion of the etch stop layer to expose a portion of the lower conductive layer;
   forming a via capping layer on the exposed portion of the lower conductive layer;
   depositing a sacrificial material layer to fill the via hole with sacrificial material;
   forming a trench aligned with the via hole by etching the sacrificial material layer, the capping layer and ILD layer;
   removing sacrificial material remaining in the via hole to expose the via capping layer;
   forming an interconnection by filling the trench and via hole with a conductive material, wherein forming the interconnection comprises:
      forming a first conformal barrier layer on the trench and via sidewalls and the via capping layer;
      removing the via capping layer and a portion of the first conformal barrier layer to expose the portion of the lower conductive layer; and
      forming a second conformal barrier layer on the exposed portion of the lower conductive layer; and
   planarizing the conductive material down to the surface of the capping layer.

2. The method of claim 1, wherein forming the interconnection further comprises:
   forming the second conformal barrier layer on the first conformal barrier; and
   depositing a layer of conductive material over the second conformal barrier layer to fill the via hole and trench with the conductive material.

3. The method of claim 1, wherein removing the via capping layer and portion of the first conformal barrier is performed using a sputtering process.

4. The method of claim 3, wherein the sputtering process comprises Ar sputtering.

5. The method of claim 1, wherein forming the via hole comprises:
   forming an AR (anti-reflection) layer;
   forming a photoresist pattern on the AR layer; and
   forming the via hole by etching the AR layer and the ILD layer using the photoresist pattern as an etch mask.

6. The method of claim 5, further comprising removing the photoresist pattern and the AR layer before removing the exposed portion of the etch stop layer and forming the via capping layer.

7. The method of claim 6, wherein the photoresist pattern is removed using an $O_2$ or $H_2$ plasma ashing process.

8. The method of claim 1, wherein forming the trench comprises:
   forming an AR (anti-reflection) layer on the sacrificial material layer;
   forming a photoresist pattern on the AR layer; and forming the trench by etching the AR layer, the sacrificial material layer and the ILD layer using the photoresist pattern as an etch mask.

9. The method of claim 1, wherein forming the via capping layer comprises selectively forming the via capping layer on the exposed portion of the conductive layer.

10. The method of claim 9, wherein selectively forming the via capping layer is performed using electroless deposition.

11. The method of claim 10, wherein the via capping layer is formed of a material including CoWP, CoSnP, CoP, CoB, CoSNB, Pd, IN or NiB.

12. The method of claim 9, wherein selectively forming the via capping layer is performed using a chemical vapor deposition process.

13. The method of claim 12, wherein the via capping layer is formed of a material including W, WNx, Ta, TaNx, Ti or TiNx.

14. The method of claim 9, wherein selectively forming the via capping layer is performed using an atomic layer deposition process.

15. The method of claim 14, wherein the via capping layer is formed of a material including W, WNx, Ta, TaNx, Ti or TiNx.

16. The method of claim 1, wherein the etch stop layer is formed of a silicon nitride, a silicon carbide, SiCN, or a combination thereof, and has an etching selectivity with respect to the ILD layer.

17. The method of claim 1, wherein the ILD layer comprises a low-k dielectric material, wherein k is less than about 4.2.

18. The method of claim 17, wherein the ILD layer is formed of an organic material.

19. The method of claim 17, wherein the ILD layer is formed of an inorganic material.

20. The method of claim 1, wherein the sacrificial material is formed of a spin-on-polymer (SOP) material.

21. The method of claim 1, wherein the sacrificial material is formed of a spin-on-glass (SOG) material.

22. The method of claim 1, wherein the via capping layer is formed to have a thickness of about 50 angstroms to about 500 angstroms.

23. The method of claim 1, wherein the via capping layer is formed of a material having copper diffusion barrier properties.

24. The method of claim 1, wherein the via capping layer is formed of a material which is resistant to corrosion or oxidation.

25. A method for forming a semiconductor device, comprising:
    forming a lower conductive layer on a semiconductor substrate;
    forming an ILD (interlayer dielectric) layer on the lower conductive layer;
    forming a capping layer on the ILD layer; and
    forming a dual damascene interconnection structure electrically coupled to a contact portion of the lower conductive layer;
    wherein forming the dual damascene interconnection structure comprises selectively forming a via capping layer on the contact portion of the lower conductive layer exposed by a via hole to protect the contact portion of the lower conductive layer from etching or corrosion during formation of the dual damascene interconnection structure, forming a first barrier layer on the via sidewalls and the via capping layer, removing the via capping layer and a portion of the first barrier layer to expose the contact portion of the lower conductive layer, and forming a second barrier layer on the exposed portion of the lower conductive layer, wherein the dual damascene interconnection structure is planarized down to the surface of the capping layer.

26. The method of claim 25, wherein forming the dual damascene interconnection structure is performed using a VFDD (via first dual damascene) process.

27. The method of claim 25, wherein selectively forming the via capping layer is performed using electroless deposition.

28. The method of claim 27, wherein the via capping layer is formed of a material including COWP, CoSnP, CoP, CoB, CoSNB, Pd, IN or NiB.

29. The method of claim 25, wherein selectively forming the via capping layer is performed using a chemical vapor deposition process.

30. The method of claim 29, wherein the via capping layer is formed of a material including W, WNx, Ta, TaNx, Ti or TiNx.

31. The method of claim 25, wherein selectively forming the via capping layer is performed using an atomic layer deposition process.

32. The method of claim 31, wherein the via capping layer is formed of a material including W, WNx, Ta, TaNx, Ti or TiNx.

33. The method of claim 25, wherein the via capping layer is formed to have a thickness of about 50 angstroms to about 500 angstroms.

34. The method of claim 25, wherein the via capping layer is formed of a material having copper diffusion barrier properties.

35. The method of claim 25, wherein the via capping layer is formed of a material which is resistant to corrosion or oxidation.

36. The method of claim 25, wherein forming the interconnection comprises:
    depositing conductive material on the second barrier layer.

37. The method of claim 25, wherein removing the capping layer is performed using a sputtering process.

38. The method of claim 37, wherein the sputtering process comprises Ar sputtering.

* * * * *